(12) United States Patent
Hauff et al.

(10) Patent No.: US 11,452,202 B2
(45) Date of Patent: Sep. 20, 2022

(54) RADIO FREQUENCY FILTERING OF PRINTED WIRING BOARD DIRECT CURRENT DISTRIBUTION LAYER

(71) Applicant: Raytheon Company, Waltham, MA (US)

(72) Inventors: John W. Hauff, Marlborough, MA (US); Orlando F. Perez, Holden, MA (US); John F. Magnani, Framingham, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 17/123,408

(22) Filed: Dec. 16, 2020

(65) Prior Publication Data

US 2022/0192009 A1  Jun. 16, 2022

(51) Int. Cl.
*H05K 1/02* (2006.01)
*H05K 1/03* (2006.01)
*H05K 3/46* (2006.01)

(52) U.S. Cl.
CPC ......... *H05K 1/0233* (2013.01); *H05K 1/0225* (2013.01); *H05K 1/0373* (2013.01); *H05K 3/4676* (2013.01); *H05K 2201/0215* (2013.01)

(58) Field of Classification Search
CPC .. H05K 1/0233; H05K 1/0225; H05K 1/0373; H05K 2201/0215
See application file for complete search history.

(56) References Cited

U.S. PATENT DOCUMENTS

| | | | | |
|---|---|---|---|---|
| 5,639,989 A | * | 6/1997 | Higgins, III | H05K 9/0039 174/394 |
| 8,446,243 B2 | | 5/2013 | Strzalkowski et al. | |
| 8,822,843 B2 | | 9/2014 | Ermolov et al. | |
| 2002/0127924 A1 | * | 9/2002 | Miura | H01P 1/215 439/894 |
| 2018/0310408 A1 | * | 10/2018 | Hamada | H05K 3/4682 |
| 2021/0104476 A1 | * | 4/2021 | Qian | H01L 23/645 |

FOREIGN PATENT DOCUMENTS

EP   0190940 A2   8/1986

* cited by examiner

*Primary Examiner* — Hoa C Nguyen
(74) *Attorney, Agent, or Firm* — Cantor Colburn LLP

(57) ABSTRACT

A method of fabricating a printed wiring board (PWB) includes etching traces to carry direct current (DC) on a first surface of a first epoxy-based layer. The first epoxy-based layer includes radio frequency (RF) absorber material. The method also includes arranging a second epoxy-based layer. The second epoxy-based layer includes the RF absorber material and includes a first surface in contact with the first surface of the first epoxy-based layer such that the traces are sandwiched between the first epoxy-based layer and the second epoxy-based layer.

20 Claims, 2 Drawing Sheets

RADIO FREQUENCY FILTERING OF PRINTED WIRING BOARD DIRECT CURRENT DISTRIBUTION LAYER

BACKGROUND

The present disclosure relates to printed wiring boards and, in particular, to radio frequency (RF) filtering of printed wiring board (PWB) power distribution.

A PWB provides mechanical support and electrical connections to electrical components. PWBs can include many layers with pass-throughs (e.g., vias) facilitating the routing of current and signals from one layer to another. PWBs are used in a wide array of applications including RF applications. In RF PWBs, direct current (DC) distribution paths can be a sneak path for unwanted RF. The result of this RF leakage can be crosstalk, oscillations, and other undesirable effects. Carbon nanotubes have been added to provide RF filtering, but the nanotubes are sensitive to the direction of the nanotubes relative to the direction of the PWB traces.

SUMMARY

Disclosed herein are methods of fabricating a printed wiring board (PWB). A non-limiting example of a method includes etching traces to carry direct current (DC) on a first surface of a first epoxy-based layer. The first epoxy-based layer includes radio frequency (RF) absorber material. The method also includes arranging a second epoxy-based layer. The second epoxy-based layer includes the RF absorber material and includes a first surface in contact with the first surface of the first epoxy-based layer such that the traces are sandwiched between the first epoxy-based layer and the second epoxy-based layer.

Another non-limiting example of a structure includes a printed wiring board. The printed wiring board includes a layer of traces to carry direct current (DC). The printed wiring board also includes a first epoxy-based layer. The layer of traces is on a first surface of the first epoxy-based layer, the first epoxy-based layer including radio frequency (RF) absorber material. The printed wiring board further includes a second epoxy-based layer. The second epoxy-based layer includes the RF absorber material and includes a first surface in contact with the first surface of the first epoxy-based layer such that the traces are sandwiched between the first epoxy-based layer and the second epoxy-based layer.

Additional features and advantages are realized through the techniques of the present disclosure. Other embodiments and aspects are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As previously noted, RF PWBs suffer from RF leakage via the DC distribution network. Different circuits are supplied with current by the DC distribution network. In a multi-layer PWB, the supply is through pass-throughs (e.g., vias) from the DC distribution network level to other layers that include the circuits. Thus, RF energy from one of the circuits may enter the DC distribution network through a pass-through and contaminate another circuit via another pass-through. Embodiments of the systems and methods detailed herein relate to RF filtering of a PWB DC distribution layer. Specifically, the DC distribution layer, which includes DC traces that supply DC to different layers of a multi-layer PWB through pass-throughs, is sandwiched by laminate layers with inherent absorbtive RF filtering capability. Specifically, ferrite or iron material is embedded in the laminate layers to attenuate any RF leakage. This creates a lossy circuit path for RF and eliminates the DC distribution as a sneak path via which RF can cross-contaminate the circuits supplied with DC.

Figure 1:
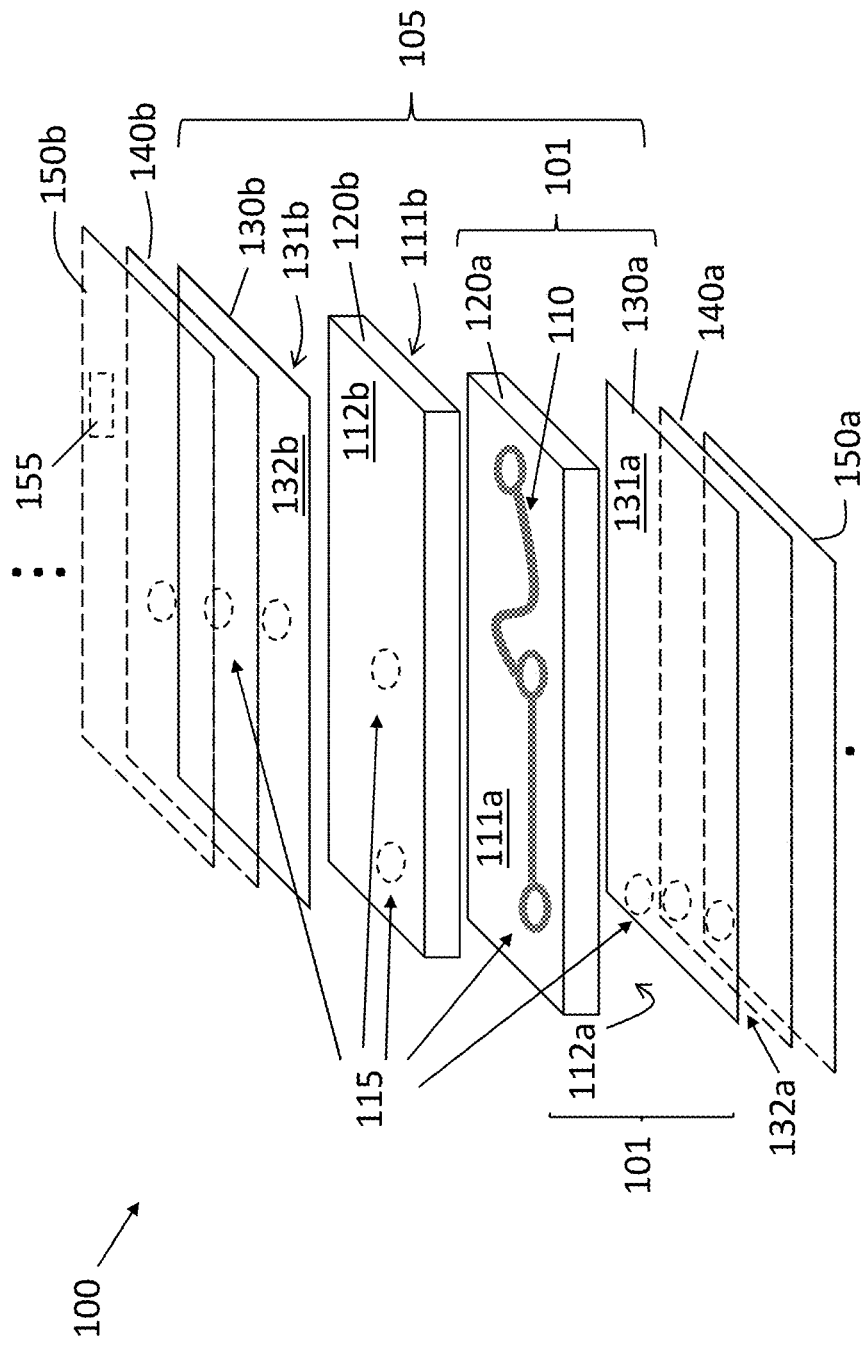
FIG. 1 is an exploded view of relevant layers of an exemplary printed wiring board with radio frequency filtering of a direct current (DC) distribution network according to one or more embodiments.

FIG. 1 is an exploded view of relevant layers of an exemplary PWB 100 with RF filtering of the DC distribution network according to one or more embodiments. While one DC stack 105 is detailed for explanatory purposes, a PWB 100 according to alternate embodiments may include more than one DC stack 105. The components of the core 101 are discussed first. This core 101 may be cured prior to stacking the other layers of the DC stack 105 and other layers. The traces 110 that make up the DC distribution are shown. The DC supply (e.g., external voltage source) is not shown.

The traces 110 are a PWB equivalent of wires. Generally, a copper layer (e.g., copper foil) is etched to remove portions and leave the traces 110. As shown in FIG. 1, the traces 110 are on a first epoxy-based layer 120a. Specifically, the traces 110 are on a first surface 111a of the first epoxy-based layer 120a. A first ground plane layer 130a and, specifically, a first surface 131a of the first ground plane layer 130a, is arranged to contact the first laminate layer 120a and, specifically, the second surface 112a of the first laminate layer 120a. The copper foil layer that is etched away to form the traces 110, the first epoxy-based layer 120a, and the first ground plane layer 130a may be cured to create the core 101 prior to the addition of other layers. Thus, the etching of the traces 110 may be on the core 101 according to exemplary embodiments.

A second epoxy-based layer 120b is arranged to sandwich the traces 110. Specifically, a first surface 111b, which is opposite the second surface 112b and is not visible in FIG. 1, is arranged in contact with the first surface 111a of the first epoxy-based layer 120a. The first epoxy-based layer 120a and the second epoxy-based layer 120b (generally referred to as 120) are epoxy resin and glass, for example. According to one or more embodiments, the epoxy-based layers 120 are embedded with an RF absorber material. The RF absorber material may be ferrite or iron according to exemplary embodiments. Based on the embedded RF absorber material, the epoxy-based layers 120 have inherent absorbtive RF filtering capability when sandwiched between the ground planes layers 130. This absorbtive RF filtering capability of the epoxy-based layers 120 is not dependent on the direction of the traces 110.

As shown in FIG. 1, a second ground plane layer 130b and, specifically, a first surface 131b of the second ground plane layer 130b, is arranged to contact the second epoxy-based layer 120b and, specifically, the second surface 112b of the second epoxy-based layer 120b. The first ground plane layer 130a and the second ground plane layer 130b (generally referred to as 130) may be copper ground plane layers, for example. The ground plane layers 130 sandwich the epoxy-based layers 120, as the epoxy-based layers 120 sandwich the traces 110 that distribute DC. Together, the DC distribution network that includes the traces 110, the epoxy-based layers 120, and the ground plane layers 130 make up the DC stack 105. When the core 101 is pre-formed, this DC stack 105 includes the core 101 with the second epoxy-based layer 120b and the second ground plane layer 130b.

Additional layers 140, 150 of the PWB 100 (e.g., dielectric layers and conductive layers) include the circuits 155 supplied by the DC stack 105. For example, additional epoxy-based layers 140a and 140b (generally referred to as 140) sandwich the DC stack 105. Additional copper layers 150 and 150b (generally referred to as 150) act as pads to install electronic components (e.g., exemplary circuit 155 shown in FIG. 1) that require the current from the DC stack 105. The numbers of additional epoxy-based layers 140 and copper layers 150 that may be part of a multi-layer PWB 100 are not limited by the exemplary embodiment shown in FIG. 1. Intermediate curing processes may be performed to form additional cores that are put together in the final PWB 100. For example, the second ground plane layer 130b and additional layers 140b and 150b may form another core (additional to core 101).

As indicated, pass-throughs 115 are formed in the epoxy-based layers 120, ground plane layers 130, and additional layers 140, 150 to route current from the DC traces to circuits 155 requiring the current. The pass-throughs are referred to as vias in layers with pads and are referred to as anti-vias in ground plane layers, for example. The RF absorber material that is embedded in the epoxy-based layers 120 and, consequently, the inherent absorbtive RF filtering capability of the epoxy-based layers 120 means that RF energy that may otherwise find a sneak path through the pass-throughs 115 is attenuated by the epoxy-based layers 120.

The attenuation increases with the length of a trace 110 (i.e., the path that the RF takes through the DC distribution network on the first laminate layer 120a). The attenuation may, to a lesser degree, decrease with increased thickness of the RF absorber-embedded epoxy-based layers 120. Thus, the length of the traces 110 may be controlled to ensure sufficient RF attenuation while ensuring that the epoxy-based layers 120 are not too thick. Simulations may be implemented to ascertain the desired lengths of the traces 110 as well as the thickness at which the epoxy-based layers 120 begin to affect attenuation in a significant way. Based on the results of the simulations, for example, for low frequency applications in particular, a trace 110 may be formed in a meandering configuration to increase its length and, thereby, increase attenuation of RF that may come into the DC distribution network through a pass-through 115 and travel along the trace 110. Specifically, the length of the traces 110 may be selected based on the lowest frequency used by circuits 155 of the PWB 100.

Figure 2:
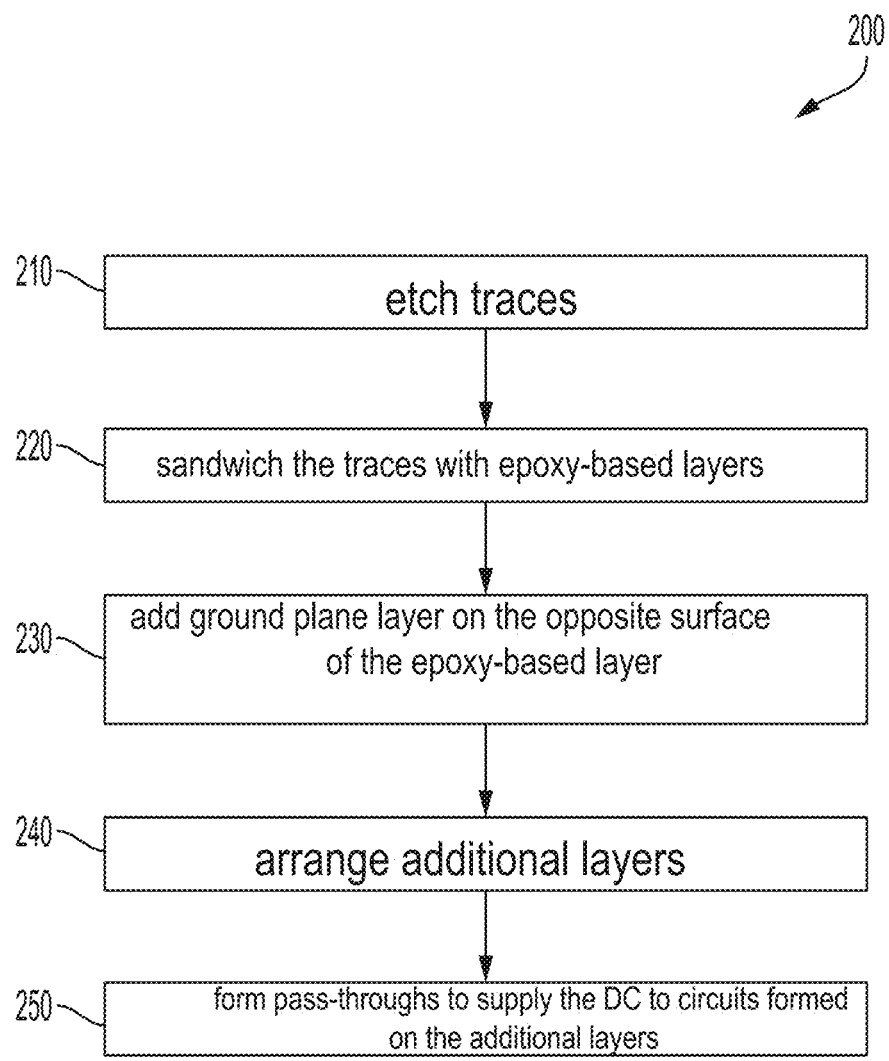
FIG. 2 is a process flow of a method of fabricating a printed wiring board with radio frequency filtering of direct current (DC) distribution according to one or more embodiments.

FIG. 2 is a process flow of a method 200 of fabricating a PWB 100 with RF filtering of the DC distribution network according to one or more embodiments. Continuing reference is made to FIG. 1. At block 210, etching traces 110 refers to removing portions of a copper foil layer to leave the traces 110 on a first surface 111a of the first epoxy-based layer 120a. As previously noted, the copper foil layer, the first epoxy-based layer 120a, and the first ground plane layer may be formed as the core 101. Thus, etching the traces 110 may refer to removing portions of the copper foil layer of the core 101. As previously noted, the exemplary core 101 may be one of two or more in a PWB 100 that is fabricated according to one or more embodiments.

At block 220, sandwiching the traces 110 that are on the first epoxy-based layer 120a (and potentially a core 101) with a first surface 111b of a second laminate layer 120b results in sandwiching the traces 110 with RF absorber material (e.g., ferrite, iron) that is embedded in the epoxy-based layers 120. The length of the traces 110 increases the attenuation of RF energy based on the absorbtive RF filtering capability of the laminate layers 120. Thus, etching the traces 110 (at block 210) includes determining a length of the traces 110 based on the frequency of the application (i.e., the frequency of the RF energy used in the circuits 155 of the PWB 100). As the frequencies of RF energy used by circuits 155 of the PWB 100 decrease, longer traces 110 may be necessary to sufficiently attenuate any RF energy that enters the DC distribution network from one circuit 155 and then travels along a trace 110 to cross-contaminate another circuit 155. As previously noted, thickness of the epoxy-based layers 120 may affect RF attenuation to a much smaller degree than trace length 110. Thus, thickness of the epoxy-based layers 120 may also be considered in the design of the PWB 100.

At block 230, adding the second ground plane layer 130b on the opposite surface (surface 112b) of the second epoxy-based layer 120b completes the DC stack 105. As previously noted, the second ground plane layer 130b may be part of a core formed with the additional layers 140b and 150b. The ground plane layers 130 may be copper ground plane layers, for example. At block 240, arranging additional layers 140, 150 may include stacking any number of additional alternating additional epoxy-based layers 140 and additional copper layers 150 on which the circuits 155 are installed. At block 250, forming pass-throughs 115 (i.e., vias and anti-vias) to supply the current from the DC distribution network to circuits 155 formed on the additional copper layers 150 no longer equates to forming sneak paths for RF to cross-contaminate circuits 155. This is because of the RF absorber material that is embedded in the epoxy-based layers 120 that sandwich the traces 110 with the ground plane layers 130.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the embodiments as disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A printed wiring board (PWB) comprising:
a layer of traces configured to carry direct current (DC), wherein at least one of the traces is a DC supply line for a circuit in another layer of the PWB;
a first epoxy-based layer, wherein the layer of traces is on a first surface of the first epoxy-based layer, the first epoxy-based layer including radio frequency (RF) absorber material; and
a second epoxy-based layer, the second epoxy-based layer including the RF absorber material and including a first surface in contact with the first surface of the first epoxy-based layer such that the traces are sandwiched between the first epoxy-based layer and the second epoxy-based layer.

2. The PWB according to claim 1, wherein the first epoxy-based layer and the second epoxy-based layer include ferrite embedded in an epoxy layer.

3. The PWB according to claim 1, wherein the first epoxy-based layer and the second epoxy-based layer include iron embedded in an epoxy layer.

4. The PWB according to claim 1, further comprising a first ground plane, a first side of the first ground plane layer being in contact with a second side, opposite the first side, of the first epoxy-based layer.

5. The PWB according to claim 4, further comprising a second ground plane, a first side of the second ground plane layer being in contact with a second side, opposite the first side, of the second epoxy-based layer.

6. The PWB according to claim 5, wherein the first ground plane and the second ground plane are copper ground planes.

7. The PWB according to claim 5, further comprising additional layers arranged on a second side, opposite the first side, of the first ground plane layer and also on a second side, opposite the first side, of the second ground plane layer.

8. The PWB according to claim 7, further comprising pass-throughs in the first epoxy-based layer, the first ground plane layer, and one or more of the additional layers on the second side of the first ground plane layer.

9. The PWB according to claim 7, further comprising pass-throughs in the second epoxy-based layer, the second ground plane layer, and one or more of the additional layers on the second side of the second ground plane layer.

10. The PWB according to claim 1, wherein a length of the traces corresponds with a lowest frequency used by circuits of the PWB.

11. A method of fabricating a printed wiring board, the method comprising:
etching traces to carry direct current (DC) on a first surface of a first epoxy-based layer, the first epoxy-based layer including radio frequency (RF) absorber material and at least one of the traces being a DC supply line for a circuit in another layer of the PWB; and
arranging a second epoxy-based layer, the second epoxy-based layer including the RF absorber material and including a first surface in contact with the first surface of the first epoxy-based layer such that the traces are sandwiched between the first epoxy-based layer and the second epoxy-based layer.

12. The method according to claim 11, wherein the first epoxy-based layer and the second epoxy-based layer include epoxy with ferrite embedded therein.

13. The method according to claim 11, wherein the first epoxy-based layer and the second epoxy-based layer include epoxy with iron embedded therein.

14. The method according to claim 11, further comprising arranging a first side of a first ground plane layer in contact with a second side, opposite the first side, of the first epoxy-based layer.

15. The method according to claim 14, further comprising arranging a first side of a second ground plane layer in contact with a second side, opposite the first side, of the second epoxy-based layer.

16. The method according to claim 15, wherein the first ground plane and the second ground plane are copper ground planes.

17. The method according to claim 15, further comprising arranging additional layers on a second side, opposite the first side, of the first ground plane layer and also on a second side, opposite the first side, of the second ground plane layer.

18. The method according to claim 17, further comprising forming pass-throughs in the first epoxy-based layer, the first ground plane layer, and one or more of the additional layers on the second side of the first ground plane layer.

19. The method according to claim 17, further comprising forming pass-throughs in the second epoxy-based layer, the second ground plane layer, and one or more of the additional layers on the second side of the second ground plane layer.

20. The method according to claim 11, further comprising controlling a length of the traces etched in the first surface of the first epoxy-based layer, wherein an increased length results in increased RF attenuation.

* * * * *